Figure 1:
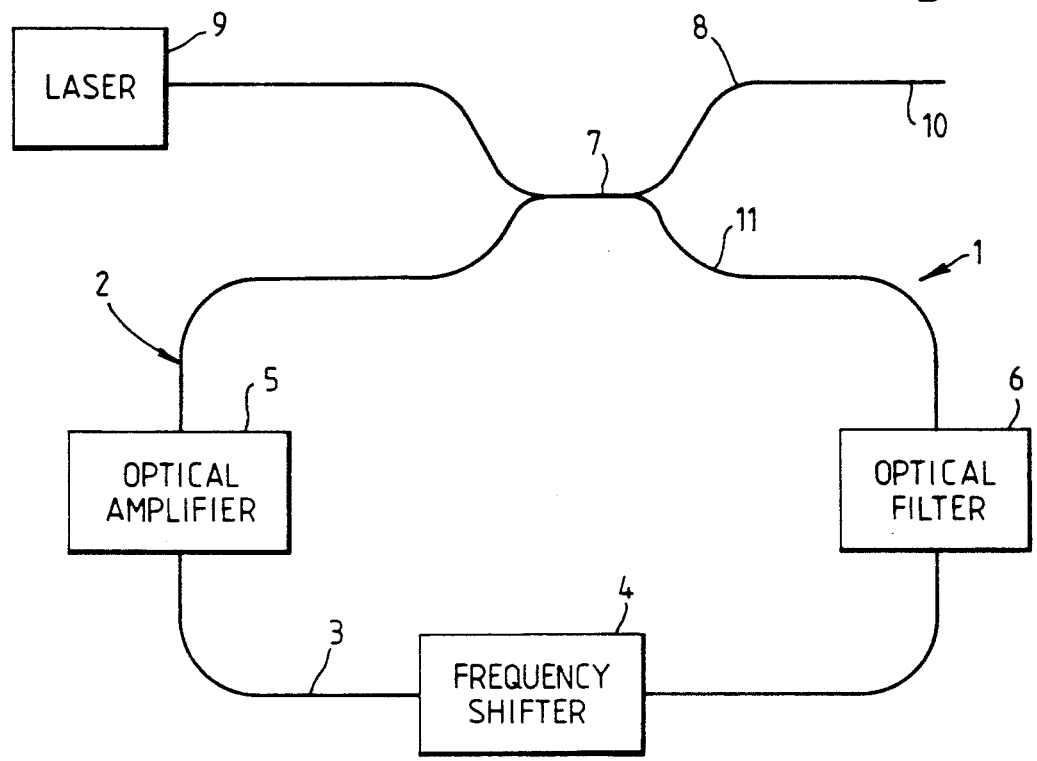

United States Patent [19]

Smith et al.

[11] Patent Number: 5,153,933
[45] Date of Patent: Oct. 6, 1992

[54] APPARATUS FOR GENERATING A COMB OF OPTICAL TEETH OF DIFFERENT WAVELENGTHS

[75] Inventors: David W. Smith, Woodbridge; Peter Healey, Ipswich; Ian W. Stanley, Tuddenham St Martin; Terence G. Hodgkinson, Woodbridge; Phillip Coppin, Cadole, all of United Kingdom

[73] Assignee: British Telecommunications public limited company, England

[21] Appl. No.: 761,900

[22] PCT Filed: Feb. 26, 1990

[86] PCT No.: PCT/GB90/00299
§ 371 Date: Sep. 12, 1991
§ 102(e) Date: Sep. 12, 1991

[87] PCT Pub. No.: WO90/10326
PCT Pub. Date: Sep. 7, 1990

[30] Foreign Application Priority Data

Mar. 2, 1989 [GB] United Kingdom ............... 8904781

[51] Int. Cl.$^5$ .............................................. G02B 6/26
[52] U.S. Cl. ........................................ 385/27; 385/32
[58] Field of Search .................... 385/1, 2, 30, 27, 32, 385/42

[56] References Cited

U.S. PATENT DOCUMENTS

| | | | |
|---|---|---|---|
| 4,136,929 | 1/1979 | Suzaki | 385/30 |
| 4,720,160 | 1/1988 | Hicks, Jr. | 385/42 |
| 4,815,804 | 3/1989 | Desurvire et al. | 385/30 |
| 5,050,183 | 9/1991 | Duling, III | 372/94 |

OTHER PUBLICATIONS

Electronics Letters, vol. 24, No. 16, 4 Aug. 1988, K. Arai et al.: "New Sensitivity-Enhancing Scheme for a Fibre-Optic Interferometer Utilising Two Optical Loops"-pp. 1000-1001.

*Primary Examiner*—Frank Gonzalez
*Attorney, Agent, or Firm*—Nixon & Vanderhye

[57] ABSTRACT

Apparatus for generating of a comb having a large number optical teeth and comprises an optical loop (3) including an optical amplifier (5) a frequency shifter (4) and an optical filter (6). A signal from a laser (9) is partially coupled into the loop by a coupler (7) such that a part of it is output at output port (10). The signal in the loop (the feedback signal) is amplified by the amplifier (5) and frequency shifted by the frequency shifter (4) and is then partially coupled out of the loop by coupler (7). The part coupled out of the loop (the output signal) exits via output port (10). This process is repeated to produce the desired number of output signals exiting via output port (10). The signal from the laser (9) may be continuous or pulsed.

13 Claims, 1 Drawing Sheet

APPARATUS FOR GENERATING A COMB OF OPTICAL TEETH OF DIFFERENT WAVELENGTHS

This invention relates to an apparatus for generating a comb of optional teeth of different wavelengths.

It is often desired to produce such combs. For example, a known sensing system is described in Electronics Letters, Aug. 4, 1988, Vol 24 No 16, in which a comb is produced by causing light from a short coherence optical source to circulate around an optical loop. The loop includes a frequency shifter, and the output signal from the loop is in the form of a comb of optical teeth of different wavelengths.

A disadvantage with this known device for producing a comb is that the amplitude of the output signal decreases rapidly and, as a result, the number of teeth in the comb having a detectable amplitude is limited to about three due to rapid decay. It is often required, however, to produce a comb having a large number of teeth all having substantially the same amplitude, for example when it is required to lock several laser sources to a single master laser.

It is an object of the present invention to overcome this disadvantage.

According to a first aspect of the present invention apparatus for generating a comb of optical teeth of different wavelengths comprises:

an optical waveguide loop including optical frequency shifting means for shifting the frequency of circulating optical signals in the loop; characterised in that said apparatus further includes:

optical amplifying means arranged in the loop for amplifying the circulating signals;

optical coupling means arranged in the loop for introducing a pulsed input coherent optical signal into the loop and for transferring a portion of the circulating signals from the loop;

a source of pulsed input coherent optical signals; and an optical filter in the loop for limiting the number of frequency shifts of the circulating optical signals.

According to a second aspect of the present invention apparatus for generating a comb of optical teeth of different wavelengths comprises:

an optical waveguide loop including optical frequency shifting means for shifting the frequency of circulating optical signals in the loop; characterised in that said apparatus further includes:

optical amplifying means arranged in the loop for amplifying the circulating signals;

optical coupling means arranged in the loop for introducing a pulsed input coherent optical signal into the loop and for transferring a portion of the circulating signals from the loop ;

a source of pulsed input coherent optical signals; and means for limiting the number of frequency shifts of the circulating optical signals, the limiting means comprising means for gating the optical amplifying means.

By including amplifying means in the loop, it is possible to compensate for the power being lost from the loop due to the transfer of a portion of the circulating signals from the loop, as well as due to inherent loss in the loop. This allows a comb to be built up having a large number of teeth of different frequencies and of substantially the same amplitude.

The optical waveguide loop may comprise a titanium in-diffused region in a lithium niobate body, or it could comprise an optically transparent semiconductor such as gallium arsenide or other 111-V compounds. Preferably, however, it comprises an optical fibre. By forming the loop from an optical fibre, it will be robust. In addition, coupling losses are lower and delays are easier to achieve than when the loop is formed in other ways. Further, the use of optical fibre is convenient, as a large number of existing optical components are fibre compatible.

Preferably, the frequency shifting means comprises a Bragg cell, although it could also comprise a low loss single sideband suppressed carrier modulator. By using an integrated optical Bragg cell, tooth spacings of up to tens of GHz may be achieved.

The frequency shifting means could also comprise a Mach-Zender modulator. A potential problem associated with using a Mach-Zehnder modulator as the frequency shifter in the loop is that it is not ideal and produces two frequencies. For pulse mode operation one of these frequencies can, in principle, be removed by using a narrow band optical filter whose centre frequency is increased or decreased in $\Delta f$ steps, as appropriate, $\Delta f$ being the loop frequency shift. If this technique is used, the filter centre frequency would always be reset to the value which corresponds to the frequency of the coherent input optical signal prior to this being pulsed. In practice it may be necessary to allocate a period of time for stepping the filter centre frequency to its new value. This can be achieved by using a loop delay which is longer than the pulse width used to switch the coherent input optical signal. A device particularly suited for this application is the wavelength tunable multi-electrode DFB/DBR semiconductor laser amplifier.

Basically, the tunable laser amplifier is an amplifying narrow bandwidth optical filter, and research devices have been reported with a 3 dB gain bandwidth about equal to 2.5 GHz, a 60 GHz tuning range and several nanosecond tuning speeds. Therefore, these early devices could be used to generate 10 tones separated by approximately 5 GHz.

The optical amplifying means could be provided by a Raman or Brillouin processes, or by a rare earth doped fibre, all of which require optical pumping. Preferably it is provided by a semiconductor laser as such a laser does not require any optical pumping. In addition, by using a semiconductor laser amplifier, four-wave mixing will have negligible effect on a frequency comb generator, especially where the tooth separation is of the order of a few Gigahertz. This is due to the fact that the refractive index of a semiconductor laser is power dependant. If, however, the effect is not negligible, feedback techniques which compensate for non-linearities in the semiconductor laser by removing refractive index modulations can be used to remove the carrier density modulation.

Figure 2:
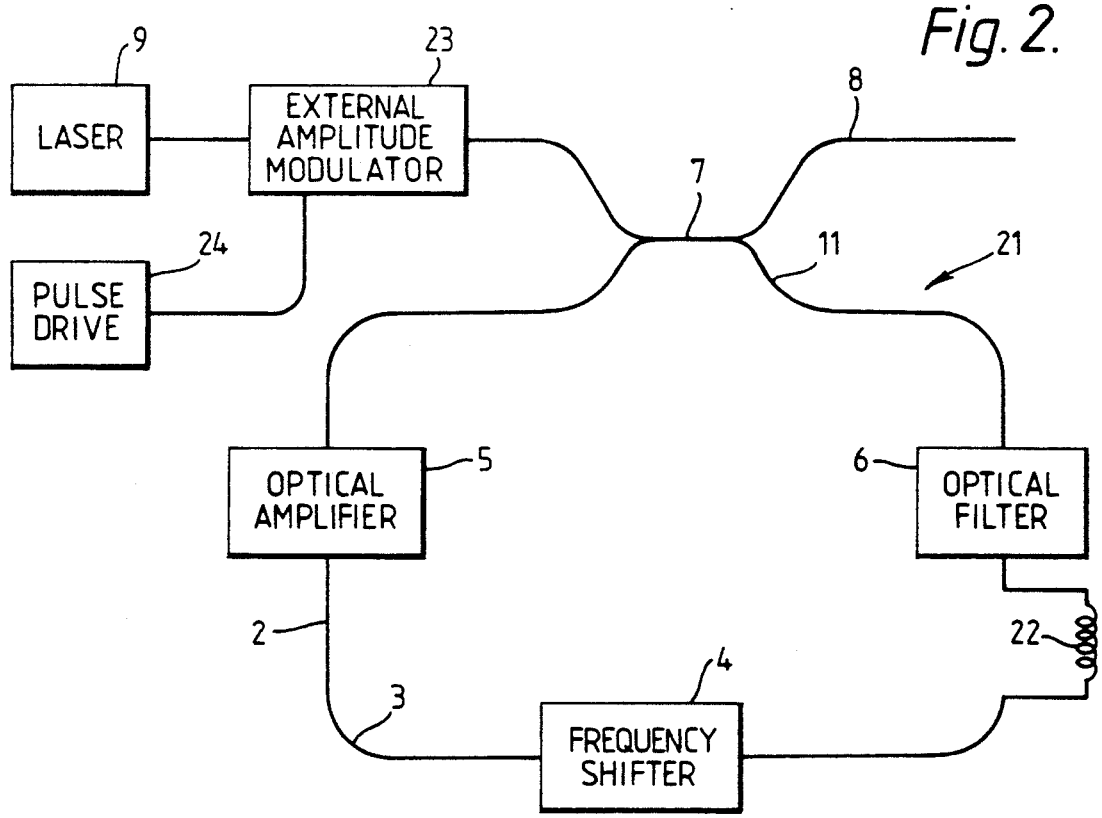

In the embodiment shown in FIG. 2 an optical filter is included in the optical waveguide loop in order that the loop bandwidth is minimised. The minimum possible filter bandwidth that can be used is approximately equal to the number of teeth required multiplied by their separation frequency. Preferably, the optical filter is a fibre-based Fabry-Perot interferometer, as it is particularly suited to this application. Alternatively, the optical filter may comprise an absorption filter, a dichroic filter a grating, an interference filter or the like.

Preferably, the optical coupling means comprises a second optical fibre evanescently coupled to the first optical fibre.

The optical coupling means may comprise a wavelength-dependent coupler. The two fibres may be fused together to form a coupler.

The input signal is pulsed. The resulting frequency comb comprises teeth, each of which forms pulse trains. A pulsed input is appropriate for applications where a tunable remote laser needs to be capable of identifying which tooth of a comb to use as its reference frequency. This is because by connecting an optical modulator to the signal output of the comb generator, and synchronising its drive to the generated pulses, the tooth to be used by the apparatus as its reference can be modulated with an identifier code which the apparatus has been designed to recognise.

An embodiment of the invention will now be described by way of example only, with reference to the accompanying drawings in which:

FIG. 1 is a schematic representation of an apparatus for generating a frequency comb from a continuous input signal which is not in accordance with the present invention; and FIG. 2 is a schematic representation of an embodiment of the invention for generating a comb from a pulsed input.

Referring to FIG. 1, an apparatus, not according to the present invention but referenced to explain the operation of generating a comb of optical teeth, is shown. The apparatus comprises an optical waveguide loop 2 formed from a length of optical fibre 3. The loop 2 includes a frequency shifter formed from a Bragg cell, an optical amplifier 5 formed from a semiconductor laser, and an optical filter 6 formed from a Febry-Perot interferometer. The apparatus 1 further includes an optical coupler 7 formed from a second length of optical fibre 8 which has been fused together with the first optical fibre 3. The apparatus further comprises a master laser 9. In use, a continuous coherent input signal is launched into the coupler 7 by the laser 9 where it is divided between the signal output port 10 and the feedback output port 11 to form an output signal and a feedback signal respectively. Typically, the coupler 7 is a 1:1 coupler, and so the input signal is divided equally between the signal output port 10 and the feedback output port 11. However, other coupling ratios may also be used. The output signal forms the first tooth of the comb, whilst the frequency of the feedback signal is shifted by frequency shifter 4. The feedback signal is then amplified by the amplifier 5 such that its power is equal to the power of the input signal. Thus, for a 1:1 coupler 7, the amplifier 5 will amplify the signal by at least a factor of 2 in order that the loop losses are overcome. The feedback signal then passes through the coupler 7 where it is divided equally between the two output ports 10, 11, the power coupled to the signal output port 10 forming the second tooth in the comb. This feedback process will be continued many times, with each transit of the feedback loop 2 generating a new tooth in the evolving frequency comb. The finite bandwidth of the loop 2 will determine the maximum number of teeth that can be generated. The optical filter 6 restricts the spectral width of the comb and minimises the noise in the feedback signal. Each of the teeth in the comb will have a distinct frequency and will be present continuously in the output signal.

The present invention will now be described by referring to FIG. 2. An apparatus 21 is shown in which components of the apparatus 21 which are equivalent to components in FIG. 1 have been given the corresponding reference numerals. The apparatus 21 comprises an optical waveguide loop 2 formed from a length of optical fibre 3. The loop 2 includes a frequency shifter 4' an optical amplifier 5 and an optical filter 6. The loop 2 further comprises an optical delay 22 which comprises a length of fibre having a delay of approximately 5 ns/m. The apparatus 21 also includes an amplitude modulator 23 positioned between the master laser 9 and the signal input to the coupler 7.

In use, the output from the master laser 9 is chopped by the amplitude modulator 23 using a pulse train from a pulse drive 24 with pulse widths less than or equal to the delay caused by the delay 22, and a repetition rate equal to N (N being the number of teeth in the comb which is determined by the bandwidth of the particular filter 6 used). The number of teeth in the comb may also be controlled by gating the amplifier. The feedback process is similar to that described for the apparatus of FIG. 1.

This pulse mode comb generation, which produces teeth which are not available all of the time, is particularly suited to applications where a tunable remote laser needs to be capable of identifying which tooth of a comb to use as its reference frequency: by connecting an optical modulator to the signal output of the comb generator, and synchronising its drive to the generated tone bursts, the tooth to be used by the transmitter as its reference can be modulated with an identifier code which the transmitter has been designed to recognise.

Because the output from the comb generator can be time gated to select any desired tone bursts, a slightly modified form of the comb generator can be used to frequency translate a digitally amplitude modulated optical carrier, provided a return-to-zero modulation format is used. If the master laser 9 is replaced by the modulated carrier and the pulse drive 24 and the amplitude modulator 23 are removed from the comb generator each data pulse will generate an identical sequence of tone bursts, the length of which should not exceed the reciprocal of the data-rate. Therefore, if the output from the comb generator is periodically gated such that one tone burst per sequence is extracted, a frequency translated version of the original input waveform will be produced, the actual translation being determined by which tone is selected. Because there will be a limited number of tone bursts per sequence, the maximum frequency translation available will be limited to the value given by multiplying $\Delta f$ with the return-to-zero pulse width, data-rate product.

It may be necessary, under certain conditions to include optical isolators between all or some of the components in both the embodiments described above in order to reduce interference between adjacent components. The apparatus may be linked to a space switch such as a star coupler formed from D-fibres and electronic switches in order that the tone bursts could be split off and directed to particular destinations.

In this specification the term "optical" is intended to refer to that part of the electromagnetic spectrum which is generally known as the visible region together with those parts of the infra red and ultra violet regions at each end of the visible region which are capable of being transmitted by dielectric optical waveguides such as optical fibres.

We claim:

1. Apparatus for generating a comb of optical teeth of different wavelengths comprising:

an optical waveguide loop (3) including optical frequency shifting means (4) for shifting the frequency of circulating optical signals in the loop (3); characterised in that said apparatus further includes:

optical amplifying means (5) arranged in the loop for amplifying the circulating signals;

optical coupling means (7) arranged in the loop (3) for introducing a pulsed input coherent optical signal into the loop (3) and for transferring a portion of the circulating signals from the loop (3);

a source of pulsed input coherent optical signals (9, 23, 24); and an optical filter (6) in the loop for limiting the number of frequency shifts of the circulating optical signals.

2. Apparatus as claimed in claim 1 in which the optical filter is a fibre-based Fabry-Perot interferometer (6).

3. Apparatus for generating a comb of optical teeth of different wavelengths comprising:

an optical waveguide loop (3) including optical frequency shifting means (4) for shifting the frequency of circulating optical signals in the loop (3); characterised in that said apparatus further includes:

optical amplifying means (5) arranged in the loop for amplifying the circulating signals;

optical coupling means (7) arranged in the loop (3) for introducing a pulsed input coherent optical signal into the loop (3) and for transferring a portion of the circulating signals from the loop (3);

a source of pulsed input coherent optical signals (9, 23, 24);

and limiting means for limiting the number of frequency shifts of the circulating optical signals, the limiting means comprising means for gating the optical amplifying means (5).

4. Apparatus according to claim 2 in which the frequency shifting means (4) comprises a Bragg cell.

5. Apparatus according to claim 1 in which the frequency shifter (4) is a Mach-Zehnder modulator.

6. Apparatus as claimed in claim 5 in which the Mach-Zehnder modulator is used in association with a narrow bandwidth optical filter with a controllable centre frequency, the apparatus further including means for controlling the filter so it removes one of the two frequencies produced by the Mach-Zehnder modulator.

7. Apparatus according to claim 6 in which the narrow bandwidth optical filter comprises a wavelength tunable multi-electrode DFB/DBR semiconductor amplifier.

8. Apparatus according to claim 1 in which the optical waveguide loop (3) comprises a first optical fibre.

9. Apparatus according to claim 8 in which the coupling means (7) comprises a second optical fibre evanescently coupled to the first optical fibre.

10. Apparatus according to claim 9 in which the optical coupling means (7) comprises a wavelength-dependent coupler.

11. Apparatus according to claim 1 in which the optical amplifying means (5) comprises a semiconductor laser amplifier.

12. Apparatus as claimed in claim 1 further including an optical modulator for modulating the signal output from the loop (3) with an identifier code.

13. Apparatus as claimed in claim 1 in which the source of pulsed input coherent optical signals provides a digitally amplitude modulated optical carrier signal having a return-to-zero modulation format and further including means for selecting one tooth of the pulse comb generated by the loop corresponding to each pulse of the pulsed input.

* * * * *